(12) United States Patent
Devlin et al.

(10) Patent No.: US 10,069,497 B2
(45) Date of Patent: Sep. 4, 2018

(54) CIRCUIT FOR AND METHOD OF IMPLEMENTING A SCAN CHAIN IN PROGRAMMABLE RESOURCES OF AN INTEGRATED CIRCUIT

(71) Applicant: Xilinx, Inc., San Jose, CA (US)

(72) Inventors: Benjamin S. Devlin, San Francisco, CA (US); Rafael C. Camarota, San Jose, CA (US)

(73) Assignee: XILINX, INC., San Jose, CA (US)

(*) Notice: Subject to any disclaimer, the term of this patent is extended or adjusted under 35 U.S.C. 154(b) by 142 days.

(21) Appl. No.: 15/191,288

(22) Filed: Jun. 23, 2016

(65) Prior Publication Data

US 2017/0373692 A1     Dec. 28, 2017

(51) Int. Cl.
| | |
|---|---|
| *H03K 19/177* | (2006.01) |
| *G01R 31/3177* | (2006.01) |
| *G01R 31/317* | (2006.01) |
| *G01R 31/3185* | (2006.01) |

(52) U.S. Cl.
CPC ... *H03K 19/17792* (2013.01); *G01R 31/3177* (2013.01); *G01R 31/31723* (2013.01); *G01R 31/318541* (2013.01); *G01R 31/318583* (2013.01); *H03K 19/1776* (2013.01); *H03K 19/17728* (2013.01)

(58) Field of Classification Search
CPC ....... H03K 19/17792; H03K 19/17728; H03K 19/1776; G01R 31/31723; G01R 31/3177; G01R 31/318583; G01R 31/318541
USPC .................. 714/725, 726, 727, 729
See application file for complete search history.

(56) References Cited

U.S. PATENT DOCUMENTS

| | | | | |
|---|---|---|---|---|
| 6,157,210 A | * | 12/2000 | Zaveri ............ | G01R 31/318516 326/37 |
| 6,481,000 B1 | * | 11/2002 | Zaveri ............ | G01R 31/318516 326/39 |
| 6,668,347 B1 | * | 12/2003 | Babella .......... | G01R 31/318536 714/730 |
| 6,897,678 B2 | * | 5/2005 | Zaveri ............ | G01R 31/318516 326/16 |
| 7,487,419 B2 | * | 2/2009 | Mukherjee ..... | G01R 31/318541 714/25 |
| 7,907,461 B1 | | 3/2011 | Nguyen et al. | |
| 7,949,916 B1 | * | 5/2011 | Ang ................ | G01R 31/31858 714/726 |
| 7,996,738 B2 | * | 8/2011 | Gemmeke ...... | G01R 31/318575 714/726 |

(Continued)

OTHER PUBLICATIONS

Specification and drawings for U.S. Appl. No. 14/939,704, filed Nov. 12, 2015, Majumdar et al.

*Primary Examiner* — John J Tabone, Jr.
(74) *Attorney, Agent, or Firm* — John J. King (57) ABSTRACT

A circuit for implementing a scan chain in programmable resources of an integrated circuit is described. The circuit comprises a programmable element configured to receive an input signal and generate an output signal based upon the input signal; a selection circuit configured to receive the output signal generated by the programmable element at a first input and to receive a scan chain input signal at a second input, wherein the selection circuit generates a selected output signal in response to a selection circuit control signal; and a register configured to receive the selected output signal of the selection circuit.

19 Claims, 8 Drawing Sheets

(56) References Cited

U.S. PATENT DOCUMENTS

| | | | |
|---|---|---|---|
| 8,566,068 B2* | 10/2013 | Quennesson | G06F 11/261 257/207 |
| 9,239,360 B2* | 1/2016 | Mittal | G01R 31/318536 |
| 9,575,120 B2* | 2/2017 | Douskey | G06F 11/2236 |
| 9,618,579 B2* | 4/2017 | Chakraborty | G01R 31/3177 |
| 9,798,352 B1* | 10/2017 | Majumdar | G06F 1/10 |
| 2003/0033584 A1* | 2/2003 | Zaveri | G01R 31/318516 716/117 |
| 2005/0283690 A1* | 12/2005 | McLaurin | G01R 31/318572 714/726 |
| 2008/0265906 A1* | 10/2008 | Waayers | G01R 31/318541 324/537 |
| 2008/0276140 A1* | 11/2008 | Gemmeke | G01R 31/318575 714/726 |
| 2008/0288842 A1* | 11/2008 | Waayers | G01R 31/318563 714/729 |
| 2013/0159800 A1* | 6/2013 | Ravi | G01R 31/3177 714/727 |
| 2013/0173976 A1* | 7/2013 | Tekumalla | G01R 31/318536 714/726 |
| 2013/0185607 A1* | 7/2013 | Tekumalla | G01R 31/318536 714/726 |
| 2013/0346816 A1* | 12/2013 | Menon | G01R 31/318572 714/727 |
| 2014/0298123 A1* | 10/2014 | Tekumalla | G06F 11/2215 714/726 |
| 2014/0298124 A1* | 10/2014 | Douskey | G06F 11/2236 714/726 |
| 2015/0082108 A1* | 3/2015 | Goel | G01R 31/318513 714/726 |
| 2015/0095729 A1* | 4/2015 | Goel | G01R 31/3177 714/726 |
| 2015/0128001 A1* | 5/2015 | Raina | G01R 31/3177 714/726 |
| 2015/0212150 A1* | 7/2015 | Mittal | G01R 31/318536 714/727 |
| 2016/0028396 A1* | 1/2016 | Gaillardon | H03K 19/0013 326/38 |
| 2016/0169969 A1* | 6/2016 | Douskey | G01R 31/318563 714/727 |
| 2016/0320448 A1* | 11/2016 | Chakraborty | G01R 31/3177 |
| 2016/0349318 A1* | 12/2016 | Pereira | G01R 31/318552 |
| 2018/0003770 A1* | 1/2018 | Nir | G01R 31/318536 |
| 2018/0004877 A1* | 1/2018 | Bershteyn | G06F 17/5027 |

* cited by examiner

CIRCUIT FOR AND METHOD OF IMPLEMENTING A SCAN CHAIN IN PROGRAMMABLE RESOURCES OF AN INTEGRATED CIRCUIT

TECHNICAL FIELD

The present invention relates generally to integrated circuit devices, and in particular, to a circuit for and a method of implementing a scan chain in programmable resources of an integrated circuit.

BACKGROUND

Programmable logic devices (PLDs), such as field programmable logic devices (FPGAs), are beneficial because they allow a user to implement a circuit designed for a specific product implementation based upon a user design at the choice of the user. However, FPGAs are generally not easy to debug. Depending on the use case, there are 2 main ways that FPGAs are typically debugged, in-system debug and prototype/emulation. There may an area of the FPGA logic that needs to be debugged because it is not working as expected. In this use case, it may be beneficial to perform in-system debug by using a software tool, such as ChipScope software available from Xilinx, Inc., to implement an Integrated Logic Analyzer (ILA) connected to the approximately 5% of signals that are selected to be monitored, perform place and route, and then interactively debug the design at system speeds. However, such an in-system debug approach is not possible for a product already in production without logic predefined.

Another debugging method includes prototype/emulation, which requires monitoring 100 percent of a design running on the FPGA. Because it may be too intrusive in terms of area and time to perform prototype and emulation of 100 percent of a design with ILA's, it may be necessary to advance the clock by one cycle, and then perform a chip read-back using a configuration network. After performing a read-back of the FPGA, it is them possible to advance the clock one cycle, and repeat. The effective "emulation" speed of the RTL on the FPGA is thus limited by this cycle of read-back followed by advancing the user clock.

Accordingly, circuits and methods that enable improved prototype/emulation of an FPGA are beneficial.

SUMMARY

A circuit for implementing a scan chain in programmable resources of an integrated circuit is described. The circuit comprises a programmable element configured to receive an input signal and generate an output signal based upon the input signal; a selection circuit configured to receive the output signal generated by the programmable element at a first input and to receive a scan chain input signal at a second input, wherein the selection circuit generates a selected output signal in response to a selection circuit control signal; and a register configured to receive the selected output signal of the selection circuit.

Another circuit for implementing a scan chain in programmable resources of an integrated circuit comprises a plurality of programmable circuits extending from a first programmable circuit to a last programmable circuit, each programmable circuit comprising: a programmable element configured to receive an input signal and generate an output signal based upon the input signal; a selection circuit configured to receive the output signal generated by the programmable element at a first input and to receive a scan chain input signal at a second input, wherein the selection circuit generates a selected output signal in response to a selection circuit control signal; and a register configured to receive the selected output signal of the selection circuit; and a first routing circuit enabling receiving the scan chain input signal routed in a scan chain of the plurality of programmable circuits from the first programmable circuit to the last programmable circuit or enabling bypassing the plurality of programmable circuits.

A method of implementing a scan chain in programmable resources of an integrated circuit is also described. The method comprises receiving an input signal at a programmable element of a configurable logic element; generating, by the programmable element, an output signal based upon the input signal; selecting the output signal generated by the programmable element or a scan chain input signal as a selected output signal; and receiving the selected output signal at a register of the configurable logic element.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods set forth below include a high speed scan chain to be implemented in programmable logic devices such as an FPGA with minimal use of user Programmable Logic Resources. The circuits and methods are particularly beneficial in emulation/prototyping applications where the entire state of the FPGA must be read out at high speed. The circuits and methods also improve high-speed manufacturing verification testing of an FPGA by reducing the read back time compared to conventional configuration network read back mechanisms.

The circuits and methods are particularly beneficial in performing debug using emulation/prototype. In conventional read back networks, it can take milliseconds to read back the FPGA state, which limits the effective emulation speed on the FPGA to being in the approximately 100 Hz range. Because it is beneficial to emulate RTL on the FPGA in the KHz-MHz range, an improvement of 1000 times is required.

The circuits and methods allow the user to create a high-speed scan chain in the FPGA without having to consume extra placement or routing resources that would otherwise be required. This allows for both a non-intrusive solution and high-speed operation. According to some implementations, this high speed operation is enabled by turning columns of CLE blocks into vertical scan chains, with programmable routing circuits at predetermined locations.

Figure 1:
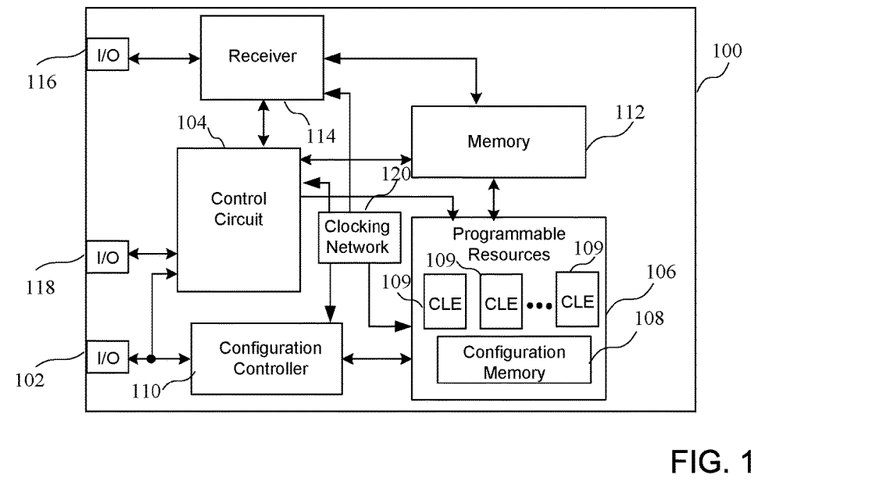
FIG. 1 is a block diagram of an integrated circuit comprising a circuit for implementing a scan chain in programmable resources of an integrated circuit.

Turning first to FIG. 1, a block diagram of an integrated circuit 100 comprising a circuit for implementing a scan chain in programmable resources of an integrated circuit. In particular, an input/output port 102 is coupled to a control circuit 104 that controls programmable resources 106 having configuration memory 108. Configuration data may be provided to the configuration memory 108 by a configuration controller 110. The configuration data enables the operation of configurable logic elements 109. A memory 112 may be coupled to the control circuit 104 and the programmable resources 106. A receiver circuit 114 may be coupled to the control circuit 104, programmable resources 106 and the memory 112, and may receive signals at the integrated circuit by way of I/O port 116. Other I/O ports may be coupled to circuits of the integrated circuit device, such as I/O port 118 that is coupled to the control circuit 104 as shown. A clocking network 120 is coupled to various elements of the circuit of FIG. 1.

Figure 2:
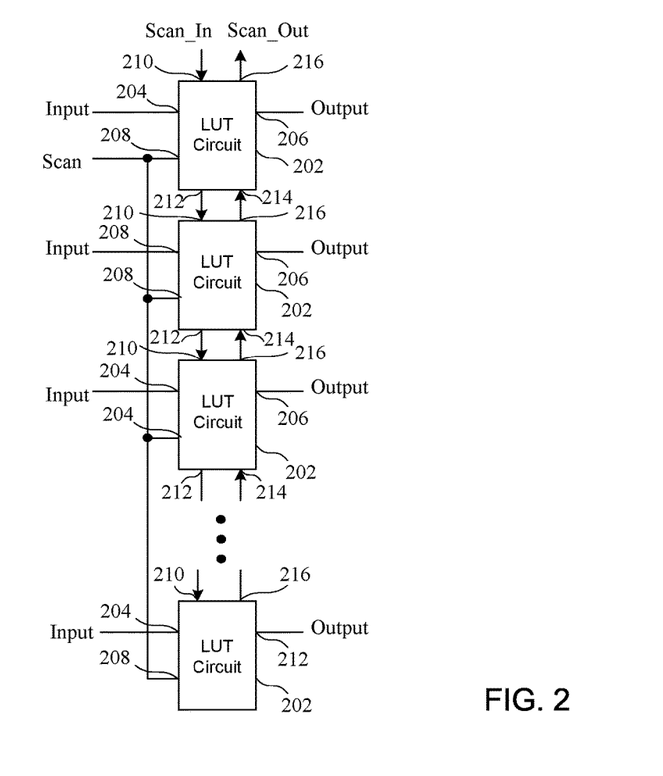
FIG. 2 is a block diagram of a plurality of LUT slice elements enabling a scan chain in an integrated circuit device.

Turning now to FIG. 2, a block diagram of a plurality of LUT slice elements enabling a scan chain in an integrated circuit device is shown. In particular, a plurality of lookup table (LUT) circuit 202 are implemented in a column as shown, where the LUT circuit include circuit elements that enable receiving a scan input signal and generating a scan output signal. Each LUT circuit 202 comprises an input 204 for receiving input data to a lookup table of the LUT circuit, and generates output data at an output 206. Each LUT circuit 202 also receives a scan control signal at a scan input 208 to enable receiving a scan input signal at an input 210 and generating a scan output to a second LUT circuit 202 at an output 212. A scan input can also be received from the second LUT slice an in input 214 and generate at a scan output 216. Scan control can be associated with particular LUT circuits of the arrangement of LUT circuits and will enable the routing of scan signals from the scan input 210 to the scan output 216 by way of a routing circuit enabling the looping back of data, as will be described in more detail below.

Figure 3:
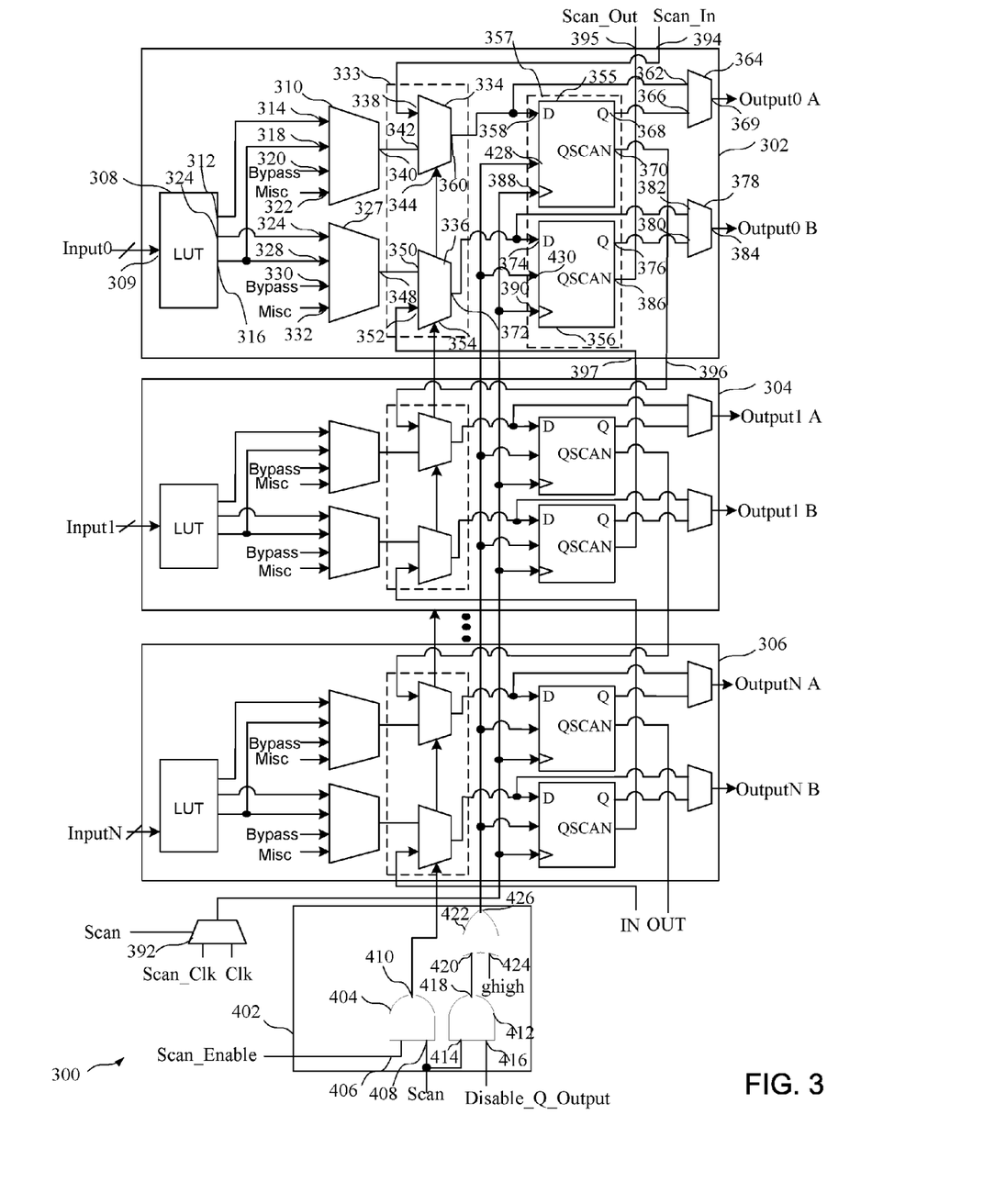
FIG. 3 is a block diagram showing circuits of a plurality of LUT slice elements enabling a scan chain in an integrated circuit device.

Turning now to FIG. 3, a block diagram shows a circuit 300 having a plurality of programmable elements such as a plurality of LUT circuits 302-306 enabling a scan chain in an integrated circuit device. While LUTs are shown in FIG. 3 by way of example, it should be understood that the circuits and methods for implementing a scan chain could include circuits implementing programmable elements other than LUTs. More particularly, each LUT circuits of the scan chain includes the elements as shown in LUT circuit 302. Each LUT circuit comprises a LUT 308 configured to receive an input signal, shown here as Input0, at an input 309. Outputs of the LUT 308 are provided to a selection circuit 310, shown here as a multiplexer. A first LUT output generated at an output 312 is coupled to a first input 314 and a second output 316 of the LUT circuit 302 is coupled to a second input 318. A bypass signal may also be coupled to a bypass input 320 and a miscellaneous signal may be coupled to a miscellaneous input 322. An output 324 is also coupled to an input 326 of a second selection circuit 327. The output 316 is also coupled to an input 328, and a second bypass signal could be coupled to a second input 330 and a second miscellaneous signal coupled to an input 332.

Outputs of the first and second selection circuits 310 and 327 are coupled to a scan chain control block 333 having a first selection circuit 334 and a second selection circuit 336. An input 338 of the first selection circuit 334 is configured to receive a scan input (Scan-In) signal to route signals from the top of the scan chain to the bottom of the scan chain. An output 340 of the selection circuit 310 is also coupled to an input 342 of the selection circuit 334. A control input 344 of the selection circuit 334 is also coupled to receive a scan control signal (Scan). An output 348 of the selection circuit 327 is coupled to an input 350 of the second selection circuit 336, which also receives a scan output of the LUT circuit 304 at an input 352 to route signals from the bottom of the scan chain to the top of the scan chain in response to the scan control circuit coupled to the control input 354.

Outputs of the scan chain control block 333 are coupled to registers 355 and 356 of a register block 357. In particular, a data input 358 of the register 355 is coupled to an output 360 of the selection circuit 334. The output 360 is also coupled to an input 362 of a selection circuit 364. A second input 366 of the selection circuit 364 is coupled to a data output 368. First output data Output0 A is generated at an output 369 of the selection circuit 364 of the register 355. The register 355 also comprises a second output 370 comprising scan output. As will be described in more detail below, the additional output of the register enables the LUT circuit 302 to be used as a part of a scan chain.

An output 372 of the selection circuit 336 is coupled to an input 374 of the register 356. A data output 376 is coupled to an input 380 of the selection circuit 378, while the data input 374 is coupled an input 382 of the selection circuit 378. Second output data Output0 B is generated at an output 384 of the selection circuit 378. The register 356 further comprises a second output 386 for generating a scan output (Scan-Out) signal.

A selection circuit 392 is configured to select one of a clock (Clk) signal and a scan clock (Scan_Clk) signal in response to a scan (Scan) signal coupled to a control terminal of the selection circuit 392. The selected output of the selection circuit 392 is coupled to a clock input 388 of the register 355 and the clock input 390 of the register 356. However, it should be noted that the clock selection circuit 392 could be implemented at locations other than within the CLE. For example, the clock selection circuit could be implemented as a part of other clock control circuits of the integrated circuit.

The LUT circuits include the scan chain control block 333 and the register block 357 including registers having an output for enabling a scan chain to enable the LUT circuits to function as both conventional programmable resources of a PLD and a scan chain element for scan chain testing. More particularly, a selection circuit associated with a register, such as selection circuit 334 coupled to register 355, enables scan input data received at a scan input 394 (which may be an input at the beginning of the scan chain or from an output of a LUT circuit above) be coupled to a data input of the register and the separate scan output 370 to be coupled to a scan output 396 (which may be an output of the scan chain or an output coupled to an input of a LUT circuit below). A scan input 397 of the LUT slice is coupled to an input 352 of the selection circuit 336, and output generated at the scan output 386 is coupled to a scan output 395, which could be an output of the scan chain or an output coupled to a scan input 397 of a LUT circuit above.

As will be described in more detail below, a scan input coupled to the scan input 394 is routed down from a first LUT circuit (i.e. LUT circuit 302) to a last LUT circuit (i.e. LUT circuit 306) through the scan chain, and then back up from the last LUT circuit 306 to the scan output 395 at the first LUT circuit 302. During normal LUT operation, inputs to the LUTs are received by the LUTs, and Output0, Output1, . . . OutputN are generated at the outputs of the LUT circuits 302-306. However, in a scan chain mode, scan inputs (i.e. scan input signals provided to scan inputs 394 and 397) and scan outputs (i.e. scan outputs signals generated at scan outputs 395 and 396) enable the routing of data in a scan chain using the registers of the register block 357, which are normally used to store outputs of the LUTs during normal operation. Accordingly, the additional multiplexers of the scan chain control block 333 and registers of the register block 357 configured to generate a separate scan output enable implementing a scan chain using elements (e.g. register elements) of a LUT slice normally used for conventional LUT operations.

Further, a scan control block 402 can be implemented to enable the LUT circuits to operate as a part of a scan chain. The scan control block 402 comprises an AND gate 404 coupled to receive a scan enable signal (Scan_Enable), which may be provided by a memory cell (MC) during configuration of the circuit for example. When a scan mode is enabled (e.g. a logical 1 is provided to an input 406 of the AND gate 404), the scan enable signal at the other input 408 of the AND gate enables a scan control signal generated at an output 410 to be provided to the LUT slices, as described above in reference to FIG. 2.

A second portion of the scan control block 402 enables controlling the registers of the LUT circuits 302-306 to allow the data provided to the data input to be generated both the Q and at the QSCAN outputs of the register, or only the QSCAN output during a scanning operation. More particularly, an AND gate 412 is configured to receive the Scan signal at the input 414 and a control signal (Disable_Q_Output) at an input 416. An output 418 is coupled to an input 420 of an OR gate 422. A global (ghigh) signal is coupled to an input 424, where a register control signal generated at the output 426 is coupled to a control input 428 of the first register 355 and a control input 430 of the second register 356. The control signal generated at the output 426 prevents the Q output from toggling by internally asserting ghigh in the CLE to conserve power. In operation, the ghigh signal is a global signal that can be provided to all of the registers in a scan chain, and is used during partial reconfiguration. The Disable_Q_Output signal can be used to selectively disable the Q output of registers during the scanning operation. That is, the Disable_Q_Output signal is also used to generate a signal at output 426 to prevent the Q output from toggling during a scan operation when the Scan signal is also high. For example, Scan_Enable for a particular scan control block 402 may be set by a programmable memory cell to allow the LUT circuits associated with that scan control block 402 to be used for a scan chain. The Disable_Q_Output signal can be set low, which allows the Q signal in an individual CLE in a scan chain to be toggling so that the scan chain can be sampled from that output. That is, the CLE is still operating in the scan chain because Scan_Enable and Scan are asserted, but the signal at the Q output is allowed to toggle.

According to one implementation, a Configurable Logic Element (CLE), which will be described in more detail in reference to in FIG. 5 for example, may consists of eight 6-input LUT circuits having 2 flip-flops at an output. A CLE circuit may also include a selection circuit for selecting a scan clock to enable scan operations instead of the clock signal for the integrated circuit. An extra output is added to a flip flop, "QSCAN," which connects to the output of the slave stage of the flip flop. Therefore, during a "Scan" mode, the Disable_Q_Output signal is made active to generate a logical 1 at the output 426, which pulls the Q output of the flip-flop to 0, and therefore saving power by preventing it from toggling.

It may be desirable to keep one output from each CLE block or each CLE column so that the shifting of the data state can be monitored by debug logic in the fabric, as will be described in more detail in reference to FIGS. 5-9. Additional circuits may also be added to enable the signals that form the scan chain to be programmed to form loops, as will be described in more detail in reference to FIGS. 6 and 7.

Figure 4:
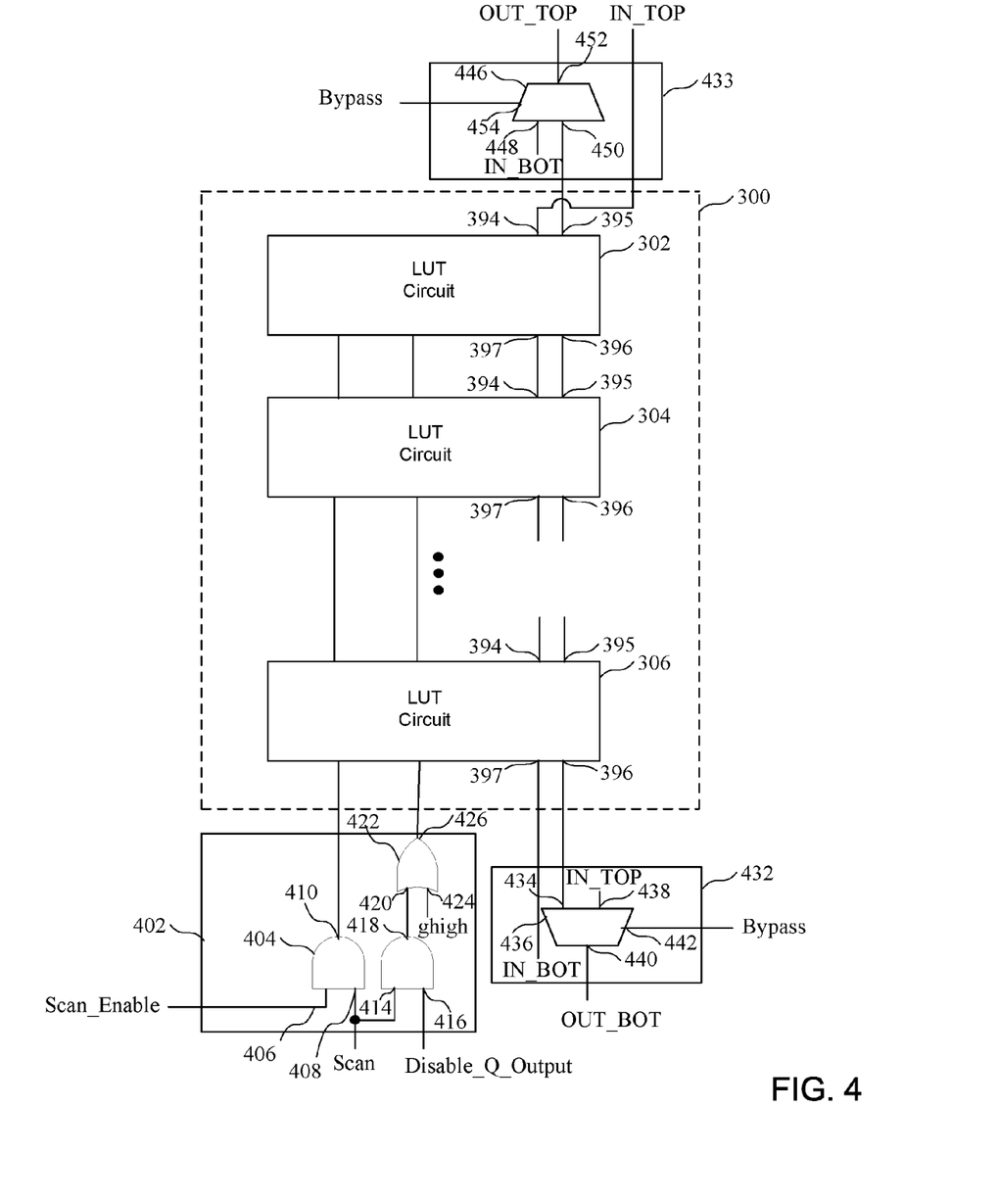
FIG. 4 is a block diagram showing routing circuits of a scan chain implemented in programmable resources in an integrated circuit device.

Turning now to FIG. 4, a block diagram shows routing circuits of a scan chain implemented in programmable resources in an integrated circuit device. Vertical columns of LUT circuits which may be implemented in one or more CLEs can be formed into scan chains. At the end of the scan chain, loops can be formed and a scan control signal can be routed to the LUT circuits of the one or more CLEs using the scan control block 402. Routing circuits are also provided for a group of LUT circuits of the circuit 300, which may comprise a CLE (having a predetermined number of LUT circuits) or a group of CLEs. That is, a first routing circuit 432 is provided at the bottom of the circuit 300 and a second routing circuit 433 is provided at the top of the circuit 300. As will be described in more detail below, the routing circuits 432 and 433 enable routing scan signals up and down the LUT circuits configured to operate as a scan chain, or enable bypassing the LUT circuits between the routing circuit 432 and the routing circuit 433. If it is desired that LUT circuits of the circuit 300 are implemented as a part of a scan chain, a selection circuit of the routing circuits is configured to enable routing scan signals from another circuit 300 above or to another circuit 300 below. That is, the routing circuit 432 is configured to receive a scan output signal at the scan output 396 at an input 434 of the selection circuit 436. An input 438 is coupled to receive an input top (IN_TOP) signal at an input 438 to generate an output bottom (OUT_BOT) at an output 440. That is, if circuit 300 of FIG. 4 is not a part of the scan chain, but a circuit 300 below the circuit 300 of FIG. 4 is a part of the scan chain, the selection circuit 440 would be controlled to route the input top (IN_TOP) signal as the OUT_BOT output. Rather than the IN_TOP signal at the output 395 of the LUT circuit 306 being routed through the scan chain and generated at the output 452 as the OUT_TOP signal, the IN_TOP signal is provided directly to the selection circuit 436 to enable the scan chain to bypass the circuit 300 of FIG. 4 in response to a bypass signal (Bypass). However, if the circuit 300 of FIG. 4 is a part of the scan chain, then the output of the scan chain generated at the output 396 and received at the input 434 of the selection circuit 436 is generated at the output 440 in response to bypass signal at input 442, enabling the routing of scan chain signals through the circuit 300 from LUT circuit 302 at the top of the circuit 300 to LUT circuit 306 at the bottom of the circuit 300.

Similarly, the routing circuit 433 enables routing a scan chain signal from below the circuit 300 of FIG. 4 to above the circuit 300. That is, a selection circuit 446 is configured to receive an input bottom (IN_BOT) signal at a first input 448 and a top output of the LUT slice 302 at an input 450 to generate a scan output (OUT_TOP) signal at an output 452 for a circuit 300 above the circuit 300 of FIG. 4 in response to the bypass signal at a control input 454. If it is desired that the circuit 300 is bypassed, the bottom input scan (IN_BOT) signal provided to scan input 397 of the LUT circuit 306 is provided directly to the routing circuit 433 in response to a bypass signal received at the control input 454 of the selection circuit 446.

Loops are formed in the scan chains so that when data is clocked through the scan chain, after clocking N cycles (where N is the height in flip-flops of the scan chain), the data is back in its original place. As a result, no additional circuitry is needed to write data back to the scan chain. That is, as reading the scan chain will shift the bits and destroy the original data otherwise, the loops enable the data to be written back to the scan chain. An example of this looping connection will be described in more detail in reference to FIGS. 5-9. The looping back of data can be done by using FPGA interconnects, which will be described in more detail in reference to FIG. 11. Some soft logic may be used to connect multiple CLE column scan chain signals (for example 50-100 CLEs) into a bus, and using AXI-stream protocol to send the data off-chip via a Network-on-Chip (NoC).

Figure 5:
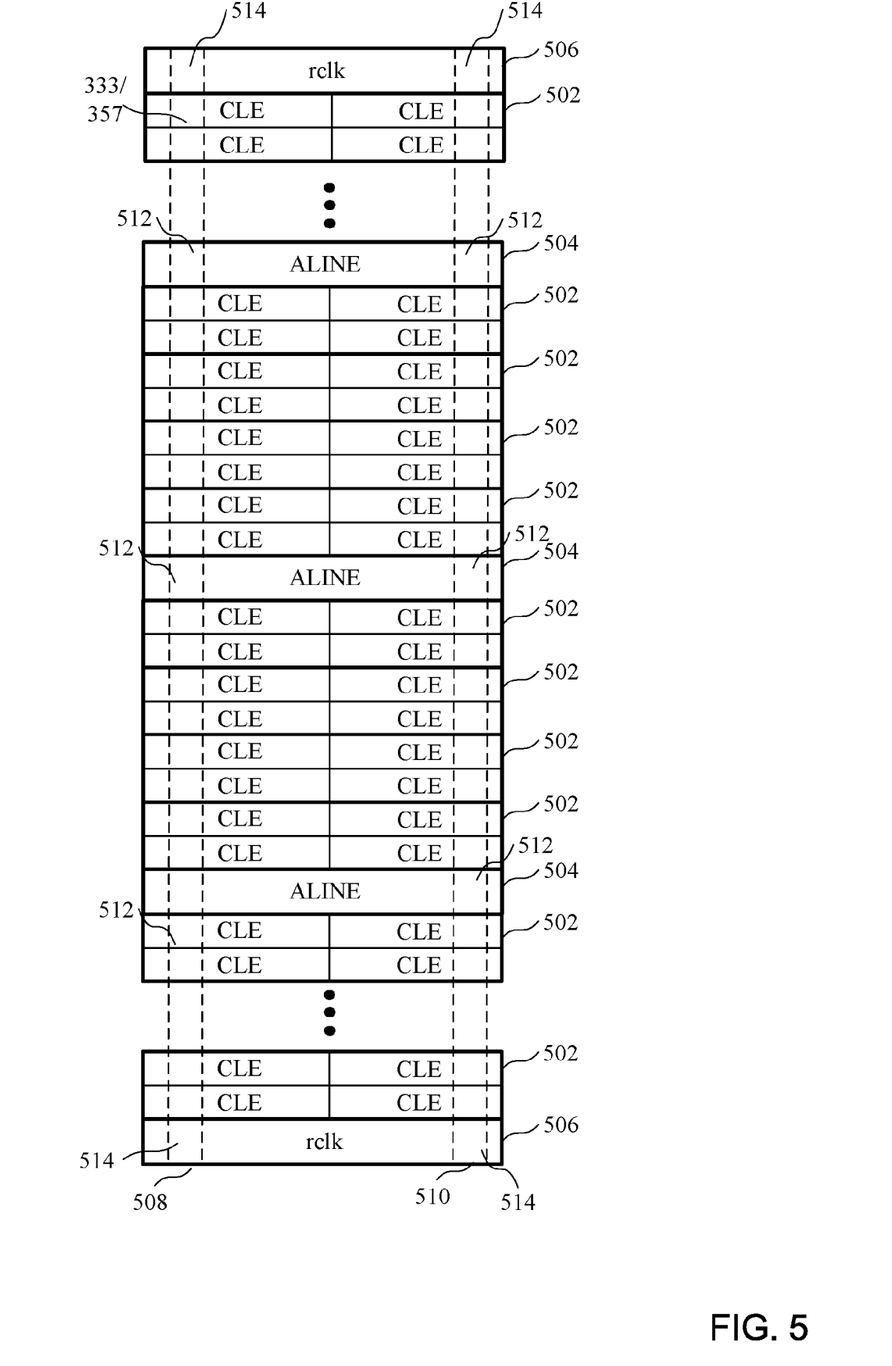
FIG. 5 is a block diagram showing an arrangement of configurable logic elements and routing circuits at different locations among the configurable logic elements.

Turning now to FIG. 5, a block diagram shows an arrangement of configurable logic elements and routing circuits at different locations among the configurable logic elements. A shown in FIG. 5, a grouping of CLEs enables the routing of two scan chains. More particularly, a CLE block 502, also known as a 4XCLE, preferably has 4 CLEs in a 2×2 CLE matrix as shown, where each CLE may comprise 8 LUT circuits (each having two flip-flops for a total of 16 flip-flops). As shown in the example of FIG. 5, an address line (ALINE) circuit 504 is implemented between 4 CLE blocks 502 arranged in a column. Further, row clock circuits 506 may also be implemented at certain location in the integrated circuit as shown. However, it should be understood a CLE includes at least one LUT circuit, but could include any number of LUT circuits.

Figure 6:
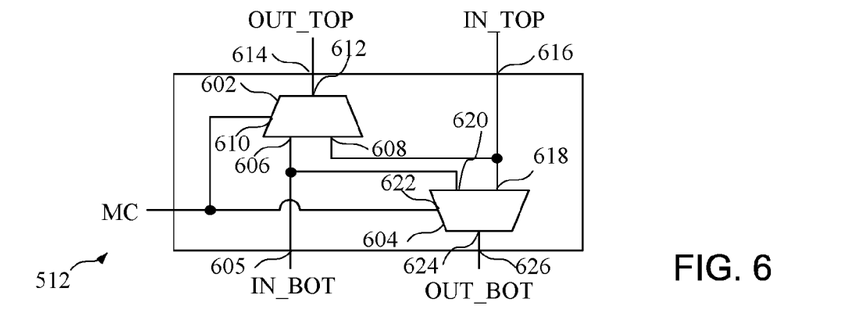
FIG. 6 is a block diagram of a routing circuit implemented in a first location of the plurality of configurable logic elements of the block diagram of FIG. 5.
Figure 7:
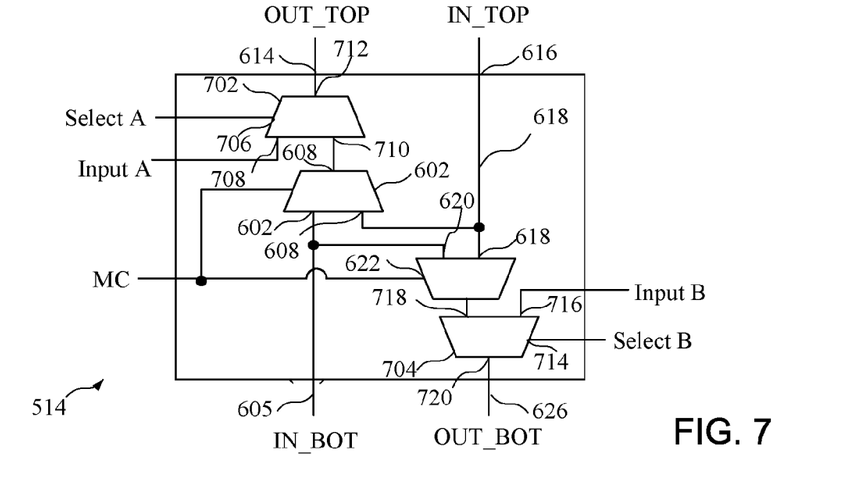
FIG. 7 is a block diagram of a routing circuit implemented in a second location of the plurality of configurable logic elements of the block diagram of FIG. 5.

Routing circuits are associated with the first scan chain 508 and the second scan chain 510, where a first routing circuit 512, described in more detail in reference to FIG. 6, is implemented for each scan chain in the ALINE circuits 504 and a second routing circuit 514, described in more detail in reference to FIG. 7, is implemented for each scan chain in the read clock circuits 506. The first routing circuits 512 and the second routing circuits 514 enable the configuration of scan chains and the looping back of data at desirable locations within the scan chain, as will be described in more detail in reference to the examples of FIGS. 8 and 9. The bypass circuits of FIG. 6 could be implemented between each 4XCLE for example.

Turning now to FIG. 6, a block diagram of a routing circuit implemented in a first location of the plurality of configurable logic elements of the block diagram of FIG. 5 is shown. The routing circuit 512 comprises a first multiplexer enabling the routing of either an input scan (IN_BOT) signal from below the routing circuit 512 to be generated as an output scan (OUT_TOP) signal, and the routing of an input scan (IN_TOP) signal from the above the routing circuit to be generated as an output scan (OUT_BOT) signal below the routing circuit. More particularly, a first selection circuit 602 and a second selection circuit 604, shown here as multiplexers, enable the routing of signals in both vertical directions between CLEs or groups of CLE in the scan chain, or looping data back. That is, the first selection circuit 602 receives the input scan (IN_BOT) signal from below the routing circuit 512 at an input 605 of the routing circuit and coupled to the input 606 of the selection circuit to be generated (in response to the signal at the control input 610) as an output scan (OUT_TOP) signal at a selection circuit output 612 coupled to an output 614. A second input 608 of the selection circuit 602 is coupled to receive the input scan (IN_TOP) signal at an input 616 from the above the routing circuit to be generated as an output scan (OUT_BOT) signal below the routing circuit (i.e. at output 626), or looped back by the selection circuit 602 in response to a control signal (shown here as a data input based upon a value stored in a memory cell (MC) during a scan operation.

The selection circuit 604 also enables the routing of a scan signal from a CLE above the selection circuit 604 to a CLE below the selection circuit 604. More particularly, the top input scan (IN_TOP) signal is coupled to a first input 618 and the bottom input scan (IN_BOT) signal is routed to a second input 620, where a control signal MC coupled to a selection input 622 enables either routing the top input (IN_TOP) signal or the bottom input (BOT_TOP) signal to the output 624 as the output scan (OUT_BOT) signals. Therefore, the routing circuit 512 enables scan data to be routed both from top to bottom and from bottom to top, or to looped back from an output of the top CLE back to an input of the top CLE and from input from the bottom CLE and looped back to the bottom CLE.

Turning now to FIG. 7, a block diagram of a routing circuit 514 implemented in a second location of the plurality of configurable logic elements of the block diagram of FIG. 5 is shown. The routing circuit 514 is similar to the routing circuit 512, but further includes selection circuits 702 and 704 to enable applying an external input from outside of the scan chain. More particularly, the selection circuit 702 is controlled by a selection signal (Select A) coupled to a selection input 706. The selection circuit 702 is also configured to receive an external input, Input A, at a first input 708 and to receive the output of the selection circuit 602 at an input 710 to generate a selected output at an output 712. Therefore, in addition to being able to pass a scan signal or loop a scan signal back as an input to the same routing circuit, the routing circuit 514 also enables providing an external input to be provided to a CLE. Similarly, the selection circuit 704 receives a selection signal (Select B) at a selection input 714 to enable selecting either a second selection input Input B at an input 716 or an output of the selection circuit 604 at an input 718 and generate the selected output at an output 720.

Figure 8:
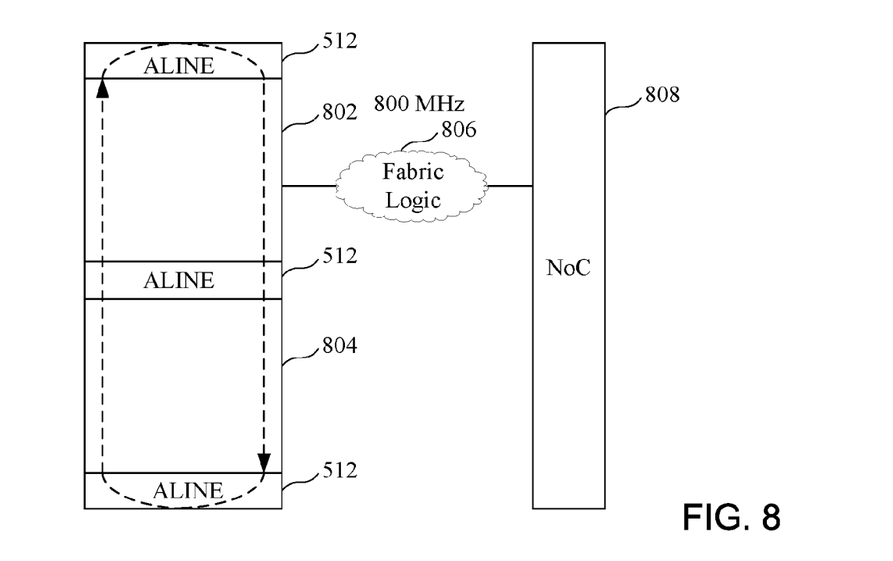
FIG. 8 is a block diagram showing a first configuration of a circuit for implementing a scan chain at a first frequency.
Figure 9:
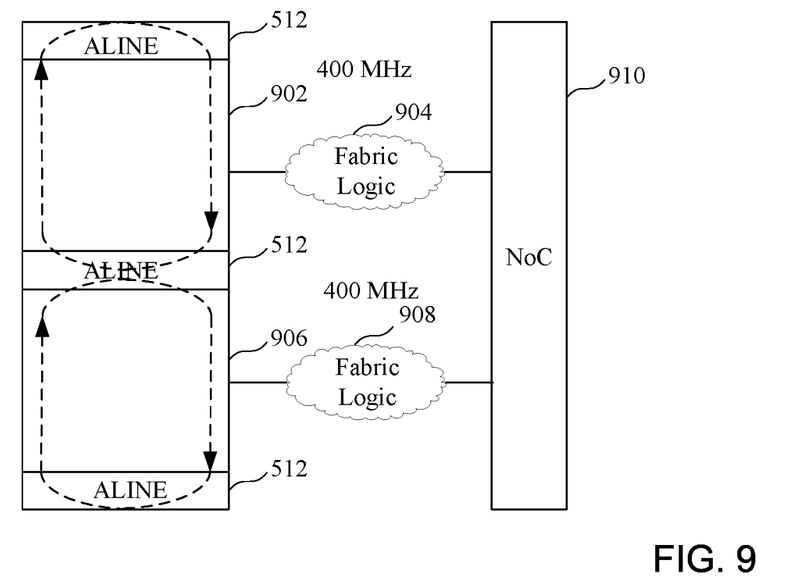
FIG. 9 is a block diagram showing a first configuration of the circuit of FIG. 7 for implementing a scan chain at a second frequency.

Turning now to FIGS. 8 and 9, block diagrams show first and second configurations of a circuit for implementing a scan chain at different frequencies, where the scan regions can be partitioned into multiple regions running at lower clock rates. That is, each of a first region 802 and a second region 804 coupled to fabric logic 806 and a Network-on-Chip (NoC) 808 can be tested together, where the circuit would need to operate at 800 MHz to achieve a desirable test rate, as shown in the implementation of FIG. 8. However, as shown in FIG. 9, the CLEs can be partitioned into two separate sections 902 and 906, each of which is coupled to separate fabric logic 904 and 908 coupled to the NoC 910, respectively, to enable scan chain testing of the CLEs. According to the implementation of FIG. 9, the scan chains associated with each of the two separate sections 902 and 906 can be run at a frequency of 400 MHz.

Figure 10:
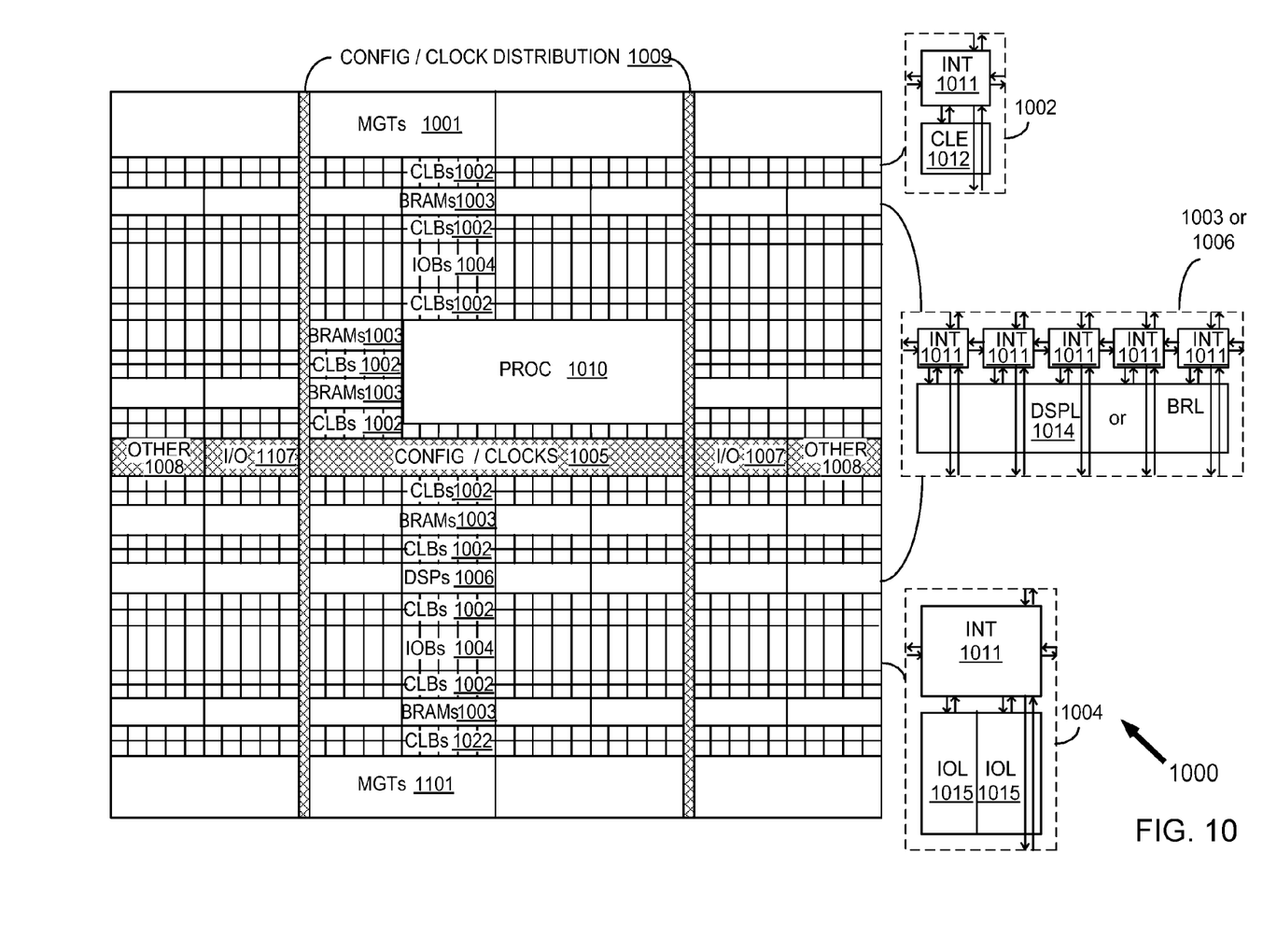
FIG. 10 is a block diagram of a programmable logic device implementing configurable logic elements enabling implementing a scan chain in an integrated circuit.

Turning now to FIG. 10, a block diagram of a programmable logic device 1000 implementing configurable logic elements enabling implementing a scan chain in an integrated circuit is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 10 comprises an FPGA architecture 1000 having a large number of different programmable tiles including multi-gigabit transceivers (MGTs) 1001, CLBs 1002, random access memory blocks (BRAMs) 1003, input/output blocks (IOBs) 1004, configuration and clocking logic (CONFIG/CLOCKS) 1005, digital signal processing blocks (DSPs) 1006, specialized input/output blocks (I/O) 1007 (e.g., configuration ports and clock ports), and other programmable logic 1008 such as digital clock managers, analog-to-digital converters, system monitoring logic, and so forth. Some FPGAs also include dedicated processor blocks (PROC) 1010, which may be used to implement a software application, for example.

In some FPGAs, each programmable tile includes a programmable interconnect element (INT) 1011 having standardized connections to and from a corresponding interconnect element in each adjacent tile. Therefore, the programmable interconnect elements taken together implement the programmable interconnect structure for the illustrated FPGA. The programmable interconnect element 1011 also includes the connections to and from the programmable logic element within the same tile, as shown by the examples included at the top of FIG. 10.

For example, a CLB 1002 may include a configurable logic element (CLE) 1012 that may be programmed to implement user logic plus a single programmable interconnect element 1011. A BRAM 1003 may include a BRAM logic element (BRL) 1013 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1006 may include a DSP logic element (DSPL) 1014 in addition to an appropriate number of programmable interconnect elements. An IOB 1004 may include, for example, two instances of an input/output logic element (IOL) 1015 in addition to one instance of the programmable interconnect element 1011. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 1009 extending from this column are used to distribute the clocks and configuration signals across the breadth of the FPGA. Some FPGAs utilizing the architecture illustrated in FIG. 10 include additional logic blocks that disrupt the regular columnar structure making up a large part of the FPGA. The additional logic blocks may be programmable blocks and/or dedicated logic. For example, the processor block PROC 1010 shown in FIG. 10 spans several columns of CLBs and BRAMs.

Note that FIG. 10 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely exemplary. For example, in an actual FPGA more than one adjacent column of CLBs is typically included wherever the CLBs appear in order to facilitate the efficient implementation of user logic. While the embodiment of FIG. 10 relates to an integrated circuit having programmable resources, it should be understood that the circuits and methods set forth in more detail below could be implemented in any type of ASIC.

Figure 11:
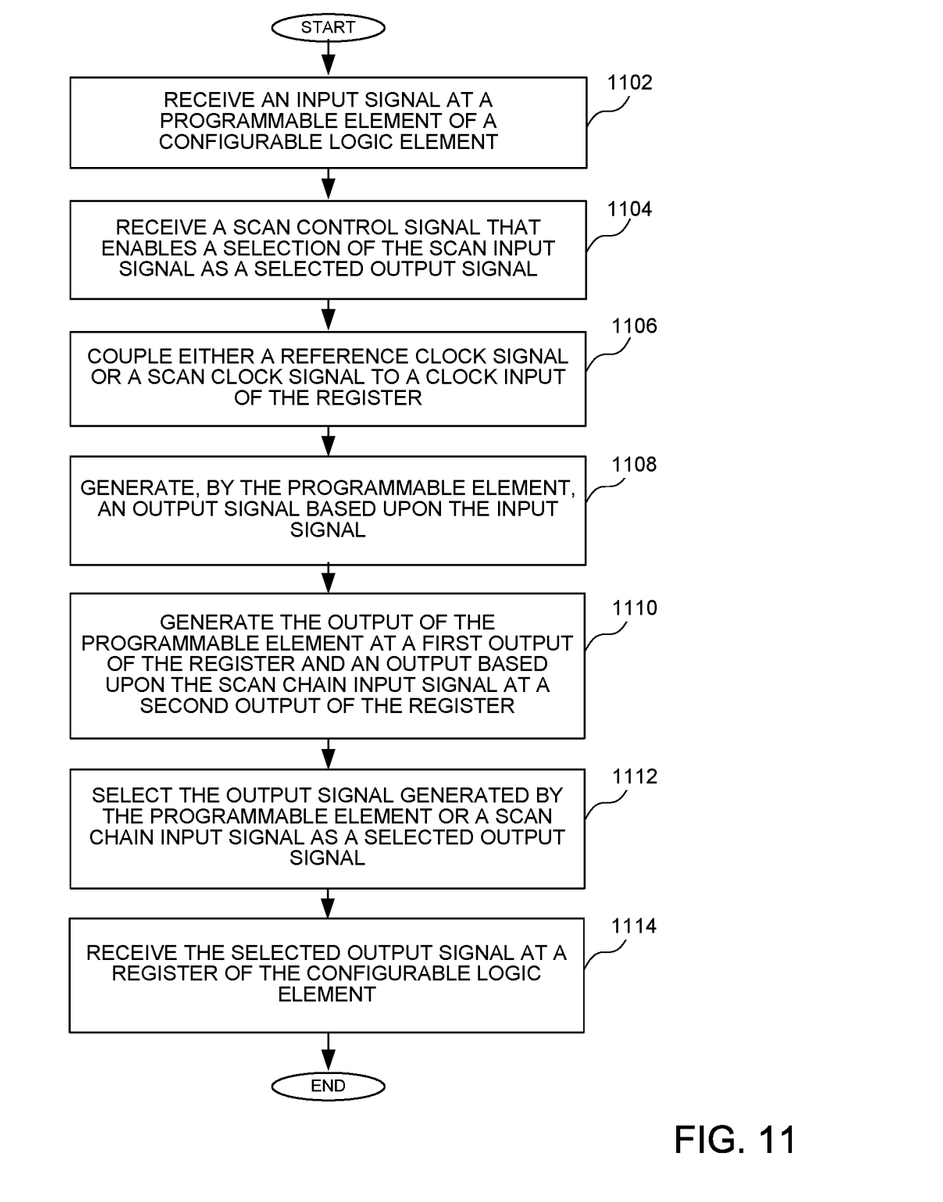
FIG. 11 is a flow chart showing a method of implementing a scan chain in programmable resources of an integrated circuit.

Turning now to FIG. 11, a flow chart shows a method of implementing a scan chain in programmable resources of an integrated circuit. In particular, an input signal is received at a programmable element of a configurable logic element at a block 1102. A scan control signal that enables a selection of the scan input signal as a selected output signal is received at a block 1104. Either a reference clock signal or a scan clock signal is coupled to a clock input of the register at a block 1106. An output signal is generated by the programmable element based upon the input signal at a block 1108. The output of the programmable element is generated at a first output of the register and an output based upon the scan chain input signal at a second output of the register at a block 1110. The output signal generated by the programmable element or a scan chain input signal is selected as a selected output signal at a block 1112. The selected output signal is received at a register of the configurable logic element at a block 1114. The elements of FIG. 11 could be implemented using any of the circuits as described above or other suitable circuits. While specific elements of the method are included in FIG. 11, it should be understood that additional elements or additional details related to the elements could be implemented as described in reference to the circuits above.

According to various implementations, the programmable element and the register may be a part of a first configurable logic element, wherein the method further comprises configuring the register to receive a scan input from a second configurable logic element, and implementing a second register configured to provide a scan output to a third configurable logic element. The first configurable logic element, the second configurable logic element, and the third configurable logic element could be associated with a block of configurable logic elements extending from a first configurable logic element to a last configurable logic element, wherein the method further may further comprise enabling a first scan signal coupled to the first configurable logic element to bypass the block of configurable logic elements. The method may further comprising enabling a second scan signal coupled to the last configurable logic element to bypass the block of configurable logic elements, as described in reference to FIG. 4 for example. The method may also comprise receiving, at a scan input of the block of configurable logic elements, an input from logic fabric of the circuit.

Considering performance analysis, an FPGA may have 60 CLE columns each which are 5 FSRs tall, or 300 CLE per column. Each CLE has 16 flip-flops, 4800 flip-flops per column. At 800 MHz, it would take 6 microseconds (µs) to toggle 4800 times (to cycle entire scan chain), after which user logic would advance the design system clock by one cycle. Therefore, an "effective emulation" speed is 166 KHz, or 100-1000× increased speed over conventional methods, which operates around 100 Hz-1 Khz range. The bandwidth being generated from all the CLE columns going into the NoC is 0.8 Gb/s per column. For example, there may be 123 CLE columns, for a total of 98.4 Gb/s bandwidth.

In a test design in a Vivado FPGA from Xilinx, Inc., several scan chains of 4800 flip-flops were placed them with constraints to form columns. In a power report with an 800 MHz clock and 50% toggle rate for several columns, the power was roughly 80 mW per column, 59 mW for flip-flop, 20 mW for interconnect, resulting in approximately 20 W total power for a device with 123 CLE columns. If it is determined that this is too much power, there are several methods to reduce the power, including using a slow clock (trade speed for power) to reduce average power, using time borrowing (clock skewing) so that columns do not all toggle at the same time to reduce instantaneous current, split scan chain regions into multiple regions (e.g. 2 FSR tall each) and run at a slower, clock speed. As shown in FIGS. 8 and 9, it is still possible achieve the same overall scan chain throughput as 2 chains running at 400 MHz with 2 connections into the NoC still producing the same throughput as one chain running at 800 MHz with 1 connection into the NoC. This circuit can also be used to perform high-speed manufacturing verification testing before the FPGA is shipped to customers. This reduced verification testing time allows test cost to be reduced by reducing test time per chip.

It can therefore be appreciated that new to circuits for and methods of implementing a scan chain in an integrated circuit have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for implementing a scan chain in programmable resources of an integrated circuit, the circuit comprising:
    a programmable element configured to receive an input signal and generate an output signal based upon the input signal;
    a first selection circuit configured to receive the output signal generated by the programmable element at a first input and to receive a first scan chain input signal at a second input, wherein the selection circuit generates a first selected output signal in response to a first selection circuit control signal;
    a first register configured to receive the first selected output signal of the first selection circuit and generate a first scan chain output signal;
    a second selection circuit configured to receive a second output signal generated by the programmable element at a first input and to receive a second scan chain input signal at a second input, wherein the selection circuit generates a second selected output signal in response to the selection circuit control signal; and
    a second register configured to receive the second selected output signal of the second selection circuit and generate a second scan chain output signal.

2. The circuit of claim 1 wherein the programmable element comprises a lookup table.

3. The circuit of claim 2 wherein the first register comprises a first output configured to generate an output of the lookup table and a second output configured to generate an output based upon the first scan chain input signal.

4. The circuit of claim 1 wherein the first selection circuit comprises a control input configured to receive the first selection circuit control signal that enables the selection of the first scan input signal received at the second input of the first selection circuit.

5. The circuit of claim 1 wherein the first register comprises a clock input, the circuit further comprising a third selection circuit having a first input configured to receive a reference clock signal and a second input configured to receive a scan clock signal.

6. The circuit of claim 1 wherein the programmable element and the first register are a part of a first configurable logic element, and the first register is configured to receive a scan input from a second configurable logic element, wherein the second register is configured to provide the second scan chain output signal to a third configurable logic element.

7. The circuit of claim 6 wherein the first configurable logic element, the second configurable logic element, and the third configurable logic element are associated with a block of configurable logic elements extending from a first configurable logic element to a last configurable logic element, the circuit further comprising a first bypass circuit that enables the first scan chain input signal coupled to the first configurable logic element to bypass the block of configurable logic elements.

8. The circuit of claim 7 further comprising a second bypass circuit that enables the second scan chain input signal coupled to the last configurable logic element to bypass the block of configurable logic elements.

9. The circuit of claim 6 wherein the first configurable logic element, the second configurable logic element, and the third configurable logic element are associated with a block of configurable logic elements extending from a first configurable logic element to a last configurable logic element, the circuit further comprising a routing circuit enabling the looping back of a scan output of a configurable logic element of the block of configurable logic elements to a scan input of the configurable logic element of the block of configurable logic elements.

10. The circuit of claim 9 wherein the routing circuit further comprises an input configured to receive an input from logic fabric of the circuit.

11. A circuit for implementing a scan chain in programmable resources of an integrated circuit, the circuit comprising:
    a plurality of programmable circuits extending from a first programmable circuit to a last programmable circuit, each programmable circuit comprising:
        a first scan chain input and a first scan chain output;
        a second scan chain input and a second scan chain output;
        a programmable element configured to receive an input signal and generate an output signal based upon the input signal;
        a selection circuit configured to receive the output signal generated by the programmable element at a first input and to receive a scan chain input signal by way of the first scan chain input at a second input, wherein the selection circuit generates a selected output signal in response to a selection circuit control signal;
        a register configured to receive the selected output signal of the selection circuit and having an output coupled to the first scan chain output;
        a second selection circuit configured to receive a second output signal generated by the programmable element at a first input and to receive a second scan chain input signal by way of the second scan chain input at a second input, wherein the second selection circuit generates a second selected output signal in response to the selection circuit control signal; and
        a second register configured to receive the second selected output signal of the second selection circuit and having an output coupled to the second scan chain output; and
    a first routing circuit enabling receiving the scan chain input signal routed in a scan chain of the plurality of programmable circuits from the first programmable circuit to the last programmable circuit or enabling bypassing the plurality of programmable circuits.

12. The circuit of claim 11 further comprising a second routing circuit enabling receiving the second scan chain input signal routed in a second scan chain of the plurality of programmable circuits from the last programmable circuit to the first programmable circuit or enabling bypasses the plurality of programmable circuits.

13. The circuit of claim 11 further comprising a scan control block configured to provide scan control signals to the plurality of programmable elements in response to a scan enable signal.

14. A method of implementing a scan chain in programmable resources of an integrated circuit, the method comprising:
    receiving an input signal at a programmable element of a configurable logic element;
    generating, by the programmable element, an output signal based upon the input signal;
    selecting the output signal generated by the programmable element or a scan chain input signal received at a first scan chain input as a selected output signal;
    receiving the selected output signal at a register of the configurable logic element to generate a first scan chain output signal in a scan chain mode;
    routing the first scan chain output signal back to a second scan chain input of the configurable logic element.

15. The method of claim 14 wherein receiving the input signal at a programmable element comprises receiving the input signal at an input of a lookup table, the method further comprising generating an output of the lookup table at a first output of the register and an output based upon the scan chain input signal at a second output of the register.

16. The method of claim 14 further comprising receiving a scan control signal that enables a selection of the scan input signal as the selected output signal.

17. The method of claim 14 wherein the programmable element and the register are a part of a first configurable logic element, the method further comprising configuring the register to receive a scan input from a second configurable logic element, and implementing a second register configured to provide a scan output to a third configurable logic element.

18. The method of claim 17 wherein the first configurable logic element, the second configurable logic element, and the third configurable logic element are associated with a block of configurable logic elements extending from a first configurable logic element to a last configurable logic element, the method further comprising enabling the first scan chain input signal coupled to the first configurable logic element to bypass the block of configurable logic elements.

19. The method of claim 17 wherein the first configurable logic element, the second configurable logic element, and the third configurable logic element are associated with a block of configurable logic elements extending from a first configurable logic element to a last configurable logic element, the method further comprising routing of a scan output of a configurable logic element of the block of configurable logic elements to a scan input of the configurable logic element of the block of configurable logic elements.

* * * * *